(12) United States Patent
Tokeshi et al.

(10) Patent No.: US 12,707,593 B2
(45) Date of Patent: Aug. 11, 2026

(54) COOLING UNIT WITH INCLINED RADIATOR AND AIR BLOWER WITH SUCTION PORT OPPOSING AN OPENING OF A VENTILATION PATH OF THE INCLINED RADIATOR

(71) Applicant: Nidec Corporation, Kyoto (JP)

(72) Inventors: Toshihiko Tokeshi, Kyoto (JP); Takehito Tamaoka, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 229 days.

(21) Appl. No.: 18/215,883

(22) Filed: Jun. 29, 2023

(65) Prior Publication Data

US 2024/0008224 A1 Jan. 4, 2024

(30) Foreign Application Priority Data

Jun. 30, 2022 (JP) ................................ 2022-105787

(51) Int. Cl.
*H05K 7/20* (2006.01)

(52) U.S. Cl.
CPC ..... *H05K 7/20263* (2013.01); *H05K 7/20136* (2013.01); *H05K 7/20381* (2013.01); *H05K 7/20327* (2013.01)

(58) Field of Classification Search
CPC ........... H05K 7/20136; H05K 7/20263; H05K 7/20272
See application file for complete search history.

(56) References Cited

U.S. PATENT DOCUMENTS 10,512,193 B1 * 12/2019 Chen ....................... G06F 1/206
2007/0272397 A1 * 11/2007 Reyzin .................... F28D 1/053 257/E23.098
2007/0295492 A1 * 12/2007 Sharp ...................... F28F 13/06 165/151
2022/0346282 A1 * 10/2022 Chen .................. H05K 7/20272
2023/0189482 A1 * 6/2023 Rivaud .............. H05K 7/20727 361/679.47

FOREIGN PATENT DOCUMENTS

JP 2002043490 A 2/2002
JP 2020035438 A 3/2020

* cited by examiner

*Primary Examiner* — Jayprakash N Gandhi
*Assistant Examiner* — Steven Ngo
(74) *Attorney, Agent, or Firm* — Keating & Bennett, LLP

(57) ABSTRACT

A cooling assembly includes a radiator, a pump and a casing. The radiator includes a plurality of refrigerant flow paths and a plurality of ventilation paths. The radiator is operable to cool a refrigerant circulating in the plurality of refrigerant flow paths with air flowing through the plurality of ventilation paths. The pump is connected to the radiator to pressurize the refrigerant. The casing accommodates the radiator and the pump. The radiator is inclined with respect to a first surface of the casing. At least a portion of the pump is positioned between the radiator and the first surface.

10 Claims, 4 Drawing Sheets

100
1
COOLING UNIT
TANK
POWER SOURCE UNIT
CONTROL UNIT
TO PUMP 13
TO FAN 171
TO PUMP 13
TO FAN 171
P
P

FROM COLD PLATE 3
TO COLD PLATE 3

COOLING UNIT WITH INCLINED RADIATOR AND AIR BLOWER WITH SUCTION PORT OPPOSING AN OPENING OF A VENTILATION PATH OF THE INCLINED RADIATOR

CROSS-REFERENCE TO RELATED APPLICATIONS

The present invention claims priority under 35 U.S.C. § 119 to Japanese Patent Application No. 2022-105787, filed on Jun. 30, 2022, the entire contents of which is hereby incorporated herein by reference.

1. FIELD OF THE INVENTION

The present disclosure relates to a cooling assembly.

2. BACKGROUND

Conventionally, in a cooling chassis, a housing has a first open end and a second open end opposing each other in an airflow direction. The housing accommodates a heat dissipation system. The heat dissipation system exchanges heat between a coolant flowing inside and air passing through the housing and the heat dissipation system. The heat dissipation system includes two radiators. Each radiator is inclined with respect to the airflow direction. The cooling chassis further includes a pump that circulates the coolant through the heat dissipation system.

In the conventional cooling chassis, the radiator is spaced away from the pump on the downstream side in the airflow direction. Therefore, it is difficult to reduce the size of the cooling chassis itself. It is difficult to increase the size of the radiator in the housing, and as a result, there has been a problem that it is difficult to improve the cooling performance of the radiator.

SUMMARY

A cooling assembly according to an example embodiment of the present disclosure includes a radiator, a pump and a casing. The radiator includes a plurality of refrigerant flow paths and a plurality of ventilation paths. The radiator is operable to cool a refrigerant circulating in the plurality of refrigerant flow paths with air flowing through the plurality of ventilation paths. The pump is connected to the radiator and pressurizes the refrigerant. The casing accommodates the radiator and the pump. The radiator is inclined with respect to a first surface of the casing. At least a portion of the pump is positioned between the radiator and the first surface.

The above and other elements, features, steps, characteristics and advantages of the present disclosure will become more apparent from the following detailed description of the example embodiments with reference to the attached drawings.

DETAILED DESCRIPTION

Figure 1:
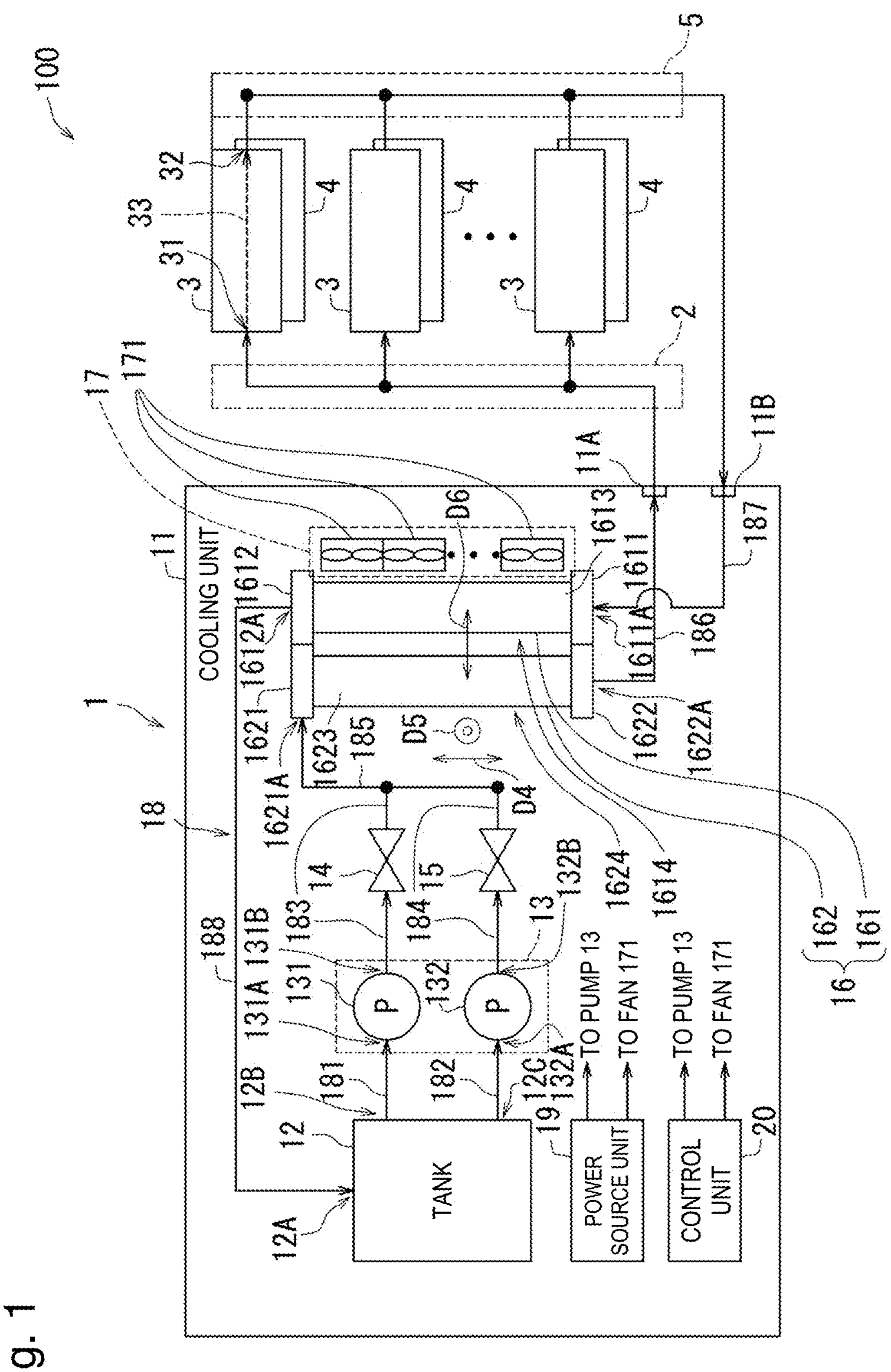
FIG. 1 is a block diagram showing a configuration of a cooling system according to an example embodiment of the present disclosure.

Hereinafter, example embodiments of the present disclosure will be described with reference to the drawings. In the drawings, the same or corresponding parts are denoted by the same reference numerals, and the description will not be repeated.

FIG. 1 is a block diagram showing the configuration of a cooling system 100 according to an example embodiment of the present disclosure. The cooling system 100 includes a cooling assembly 1, a distribution manifold 2, a plurality of cold plates 3, a plurality of heat sources 4, and a collection manifold 5.

In the cooling system 100, a refrigerant circulates among the cooling assembly 1, the distribution manifold 2, the plurality of cold plates 3, and the collection manifold 5. The refrigerant is a cooling liquid. Examples of the cooling liquid include antifreeze liquid and pure water. A typical example of antifreeze liquid is an ethylene glycol aqueous solution or a propylene glycol aqueous solution. Specifically, a high-temperature refrigerant flows into the cooling assembly 1 from the collection manifold 5. The cooling assembly 1 pressurizes and cools the refrigerant. When the refrigerant is pressurized, the refrigerant circulates in the cooling system 100. A low-temperature refrigerant flows into the plurality of cold plates 3 via the distribution manifold 2 and circulates in the plurality of cold plates 3. The plurality of cold plates 3 come into thermal contact with the plurality of heat sources 4. Each of the heat sources 4 is a device that generates heat. In the example embodiment, each of the heat sources 4 is a component of a computer device, and more specifically, is any of, for example, an electrolytic capacitor, a power semiconductor module, and a printed circuit board.

Each of the cold plates 3 has an inflow port 31, an outflow port 32, and a flow path 33. In FIG. 1, for convenience, reference numerals "31", "32", and "33" are representatively given only to one cold plate 3. The refrigerant flows into a plurality of inflow ports 31 from the distribution manifold 2. The refrigerant circulates in the flow path 33 from the inflow port 31 toward the outflow port 32. Therefore, the heat generated by the heat source 4 moves to the refrigerant circulating in each of the flow paths 33. The high-temperature refrigerant flows out from each outflow port 32 to the collection manifold 5.

Next, a detailed configuration of the cooling assembly 1 will be described. The cooling assembly 1 includes a casing 11, a tank 12, a pump unit 13, two electromagnetic valves 14 and 15, a heat exchange unit 16, an air blowing assembly 17, a refrigerant flow path 18, a power source assembly 19, and a controller 20. The refrigerant flow path 18 includes pipes 181 to 188.

The casing 11 has a refrigerant outflow port 11A and a refrigerant inflow port 11B. The outflow port 11A and the inflow port 11B are connected to the distribution manifold 2 and the collection manifold 5, respectively. The refrigerant flows out of the outflow port 11A to the distribution manifold 2. The refrigerant flows into the inflow port 11B from the collection manifold 5. Between the inflow port 11B and the outflow port 11A, the tank 12, the pump unit 13, the electromagnetic valves 14 and 15, and the heat exchange unit 16 are connected by the pipes 181 to 188. As a result, the refrigerant can circulate the tank 12, the pump unit 13, and the heat exchange unit 16 in this order.

The casing 11 accommodates the tank 12, the pump unit 13, the two electromagnetic valves 14 and 15, the heat exchange unit 16, the air blowing assembly 17, the refrigerant flow path 18, the power source assembly 19, and the controller 20.

Specifically, the tank 12 has a refrigerant inflow port 12A and refrigerant outflow ports 12B and 12C. The other end of the pipe 188 is connected to the inflow port 12A. The tank 12 stores the refrigerant flowing in from the inflow port 12A. One ends of the pipes 181 and 182 are connected to the refrigerant outflow ports 12B and 12C, respectively. The refrigerant stored in the tank 12 flows out of the outflow ports 12B and 12C.

In the cooling system 100, the refrigerant decreases due to evaporation or the like. Therefore, the refrigerant needs to be replenished as appropriate. However, by providing the tank 12 as in the example embodiment, it is possible to reduce the frequency of replenishment of the refrigerant. The tank 12 is an optional additional component to the cooling system 100.

The pump unit 13 has two pumps 131 and 132. The two pumps 131 and 132 are an example of a "plurality of pumps" in the present disclosure. The pump 131 is connected to a second radiator 162 via the pipes 183 and 185. The pump 132 is connected to the second radiator 162 via the pipes 184 and 185. The pumps 131 and 132 pressurize the refrigerant.

Specifically, the pump 131 has a suction port 131A, a discharge port 131B, and an impeller that is not shown. The suction port 131A is connected to the other end of the pipe 181. The discharge port 131B is connected to one end of the pipe 183. The pump 131 applies pressure to the refrigerant when the impeller rotates under control of the controller 20. As a result, the refrigerant in the pipe 181 is sucked from the suction port 131A. The sucked refrigerant is discharged from the discharge port 131B to the pipe 183.

The pump 132 has a suction port 132A, a discharge port 132B, and an impeller that is not shown. Since the pump 132 may have the same configuration as the pump 131, detailed description of the pump 132 will be omitted.

The electromagnetic valves 14 and 15 are positioned in the middle of the pipes 183 and 184, respectively, and open and close the pipes 183 and 184, respectively, under control of the controller 20. The electromagnetic valves 14 and 15 are optional additional components to the cooling assembly 1.

The heat exchange unit 16 cools the refrigerant circulating in the cooling assembly 1. Specifically, the heat exchange unit 16 has a first radiator 161 and the second radiator 162 positioned between the first radiator 161 and a first surface 111 of the casing 11 (see FIG. 2). At least one of the first radiator 161 and the second radiator 162 is an example of a "radiator" in the present disclosure. That is, the cooling assembly 1 has the first radiator 161 and the second radiator 162 as an example of the "radiator" in the present disclosure.

The first radiator 161 has two tanks 1611 and 1612, a plurality of refrigerant flow paths 1613, and a plurality of ventilation paths 1614. The first radiator 161 cools the refrigerant circulating in the plurality of refrigerant flow paths 1613 with air flowing through the plurality of ventilation paths 1614.

The second radiator 162 has two tanks 1621 and 1622, a plurality of refrigerant flow paths 1623, and a plurality of ventilation paths 1624, and cools the refrigerant circulating in the plurality of refrigerant flow paths 1623 with air flowing through the plurality of ventilation paths 1624.

Further details of the first radiator 161 and the second radiator 162 will be described later.

The air blowing assembly 17 has a plurality of fans 171. Each of the fans 171 is, for example, an axial fan. The air blowing assembly 17 causes each of the fans 171 to generate an airflow in each of the ventilation paths 1614 and 1624. As a result, the air outside the casing 11 flows into an internal space 11C of the casing 11 from an inlet port 116A. The air having flowed in circulates in the internal space 11C and then flows out of the casing 11 through an exhaust port 115A.

The power source assembly 19 is a power source circuit or the like. The power source assembly 19 generates a drive voltage for operating the pump 131 and the fan 171 from an AC voltage supplied from a commercial power source or the like. The power source assembly 19 supplies the generated drive voltage to the pump 131 and the fan 171.

The controller 20 has a microcomputer, a memory, and the like that are not shown. The microcomputer operates according to a program stored in the memory, and controls operations of the pumps 131 and 132, the electromagnetic valves 14 and 15, and the plurality of fans 171. The controller 20 further has a casing 201 that accommodates the microcomputer and the memory.

Figure 2:
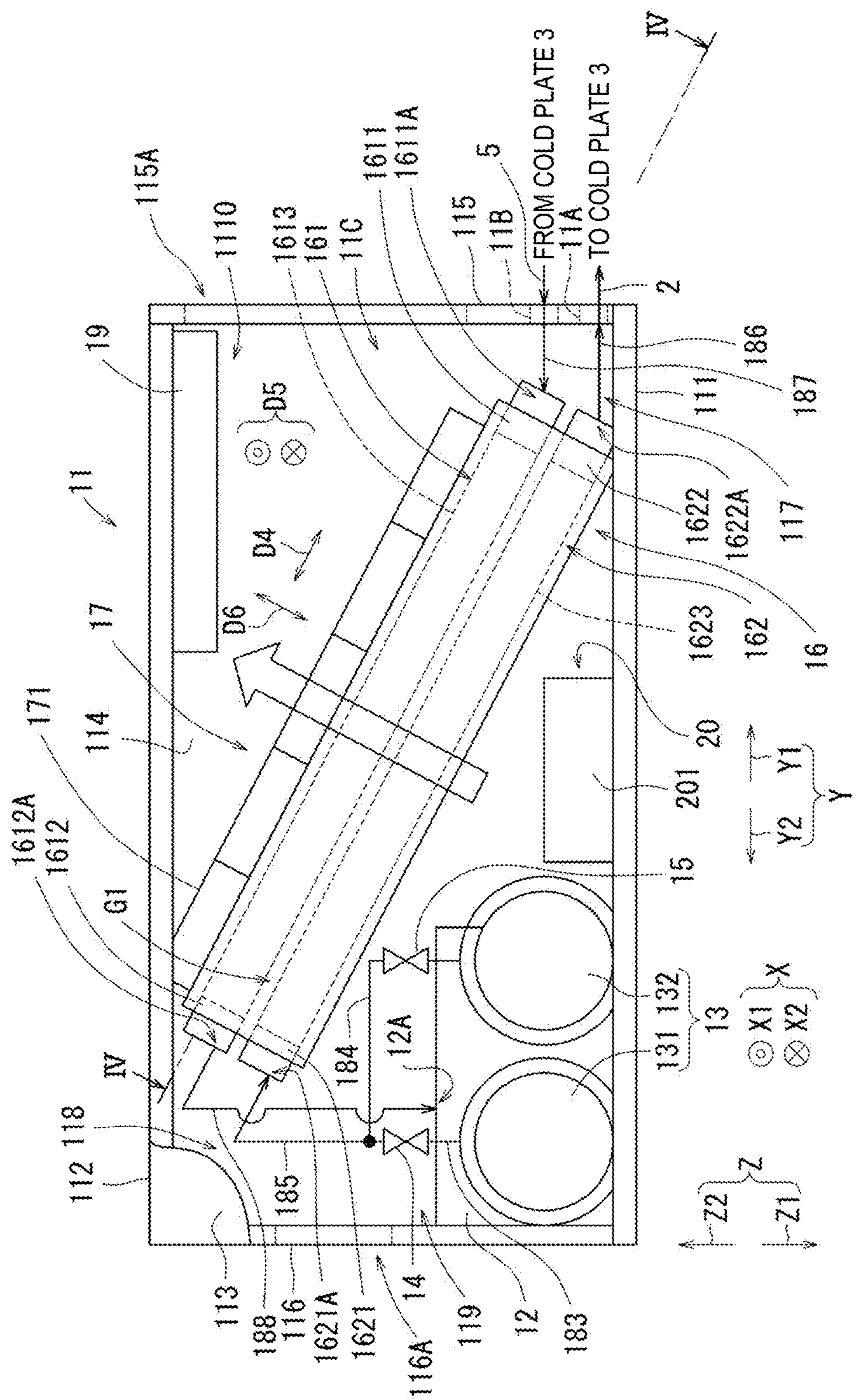
FIG. 2 is a side view of a cooling assembly shown in FIG. 1 as viewed from one side in a second direction.
Figure 3:
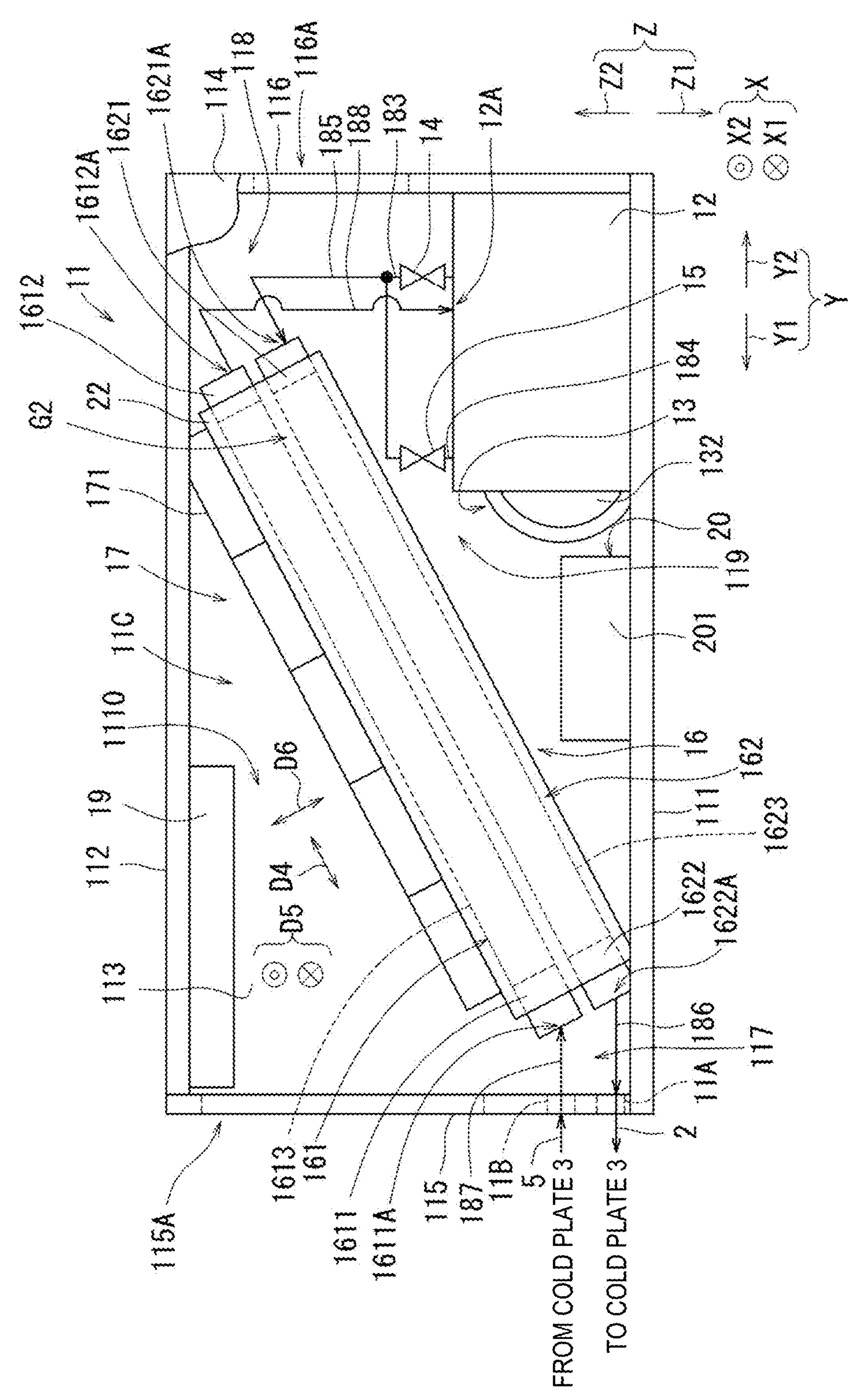
FIG. 3 is a side view of the cooling assembly shown in FIG. 1 as viewed from the other side in the second direction.
Figure 4:
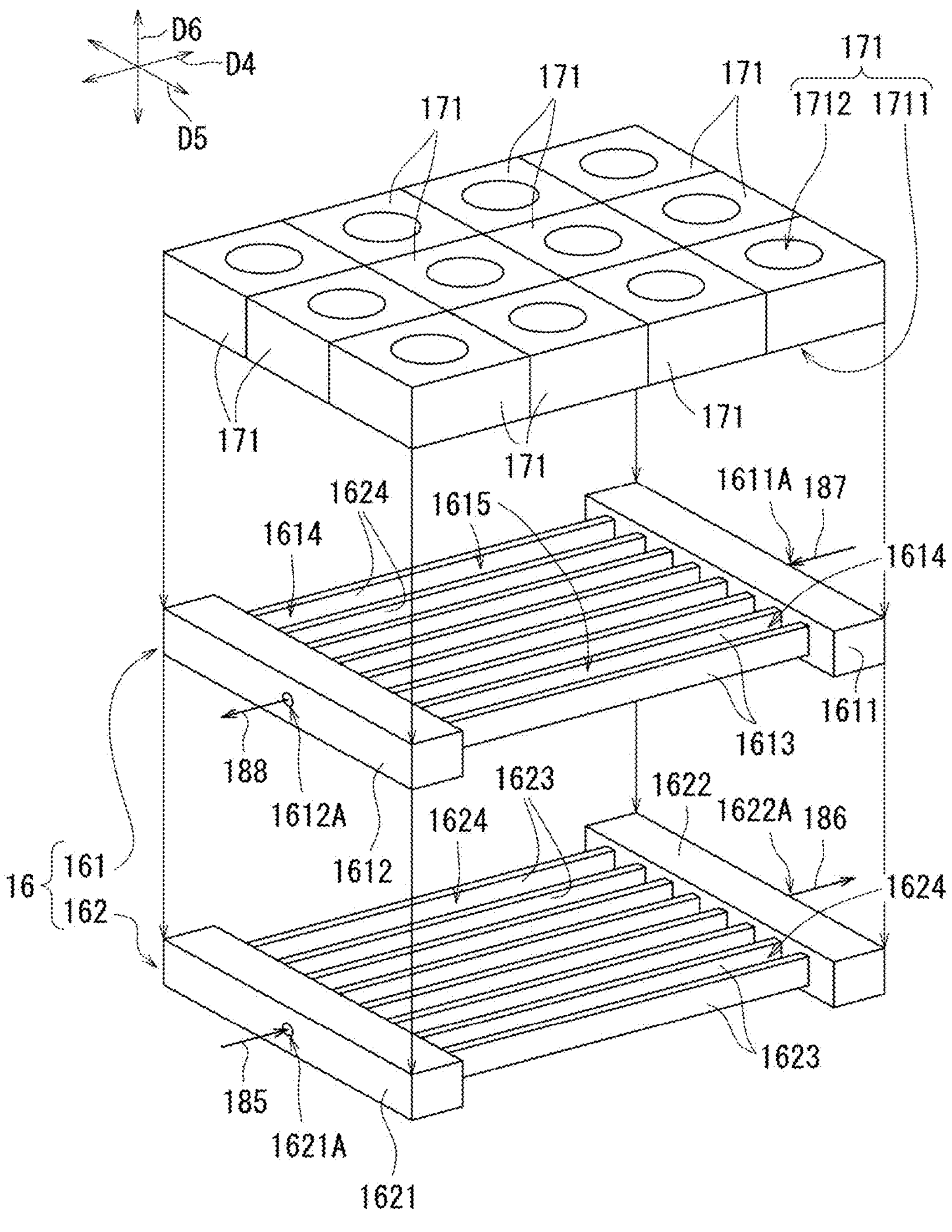
FIG. 4 is an exploded perspective view of a first radiator, a second radiator, and an air blowing assembly shown in FIG. 2.

FIG. 2 is a side view of the cooling assembly 1 shown in FIG. 1 as viewed from second direction one side X1. FIG. 3 is a side view of the cooling assembly 1 shown in FIG. 1 as viewed from the second direction other side X2. FIG. 4 is a view of a cross section of the first radiator 161 taken along line IV-IV shown in FIG. 2 as viewed in an orthogonal direction D6.

For reference, FIGS. 2 and 3 show a first direction Z, a second direction X, and a third direction Y orthogonal to one another. In the example embodiment, the first direction Z is parallel to a vertical direction. Each of the second direction X and the third direction Y is parallel to a horizontal direction. The vertical direction may be the second direction X or the third direction Y.

One side in the first direction Z may be described as a first direction one side Z1. The other side in the first direction Z may be described as a first direction other side Z2. In the example embodiment, the first direction one side Z1 and the first direction other side Z2 are a vertically lower direction and a vertically upper direction. One side in the second direction X may be described as a second direction one side X1. The other side in the second direction X may be described as a second direction other side X2. One side in the third direction Y may be described as a third direction one side Y1. The other side in the third direction Y may be described as a third direction other side Y2. The "orthogonal direction" also includes a substantially orthogonal direction.

The casing 11 has a substantially rectangular parallelepiped outer shape, and as shown in FIGS. 2 and 3, has the first surface 111, a second surface 112, a third surface 113, a fourth surface 114, a fifth surface 115, and a sixth surface 116 as a plurality of surfaces. The plurality of surfaces defines the internal space 11C of the casing 11. The first surface 111 and the second surface 112 face the first direction one side Z1 and the first direction other side Z2 in a state where the cooling assembly 1 is installed in a usable manner (hereinafter, described as a "use state"). The third surface 113 and the fourth surface 114 face the second direction one side X1 and the second direction other side X2 in the use state. In FIGS. 2 and 3, only a part of the third surface 113 and a part of the fourth surface 114 are shown to show the internal configuration of the casing 11. The fifth surface 115 and the sixth surface 116 face the third direction one side Y1 and the third direction other side Y2 in an installation state. In the example embodiment, the fifth surface 115 is provided with the exhaust port 115A, and the sixth surface 116 is provided with the inlet port 116A.

As shown in FIGS. 2 to 4, in the first radiator 161, the tanks 1611 and 1612 are separated by a distance in a first separation direction D4. The first separation direction D4 is inclined with respect to the first surface 111. The tank 1611 has an inflow port 1611A. The inflow port 1611A is connected to the inflow port 11B of the casing 11 by the pipe 187. The tank 1612 has an outflow port 1612A. The outflow port 1612A is connected to the inflow port 12A of the tank 12 by the pipe 188. Each of the plurality of refrigerant flow paths 1613 is a metal tube or the like, and extends along the first separation direction D4 between the tank 1611 and the tank 1612. The plurality of refrigerant flow paths 1613 are arranged at intervals in a second separation direction D5 (see FIG. 4 in particular). In the plurality of refrigerant flow paths 1613, the refrigerant can circulate from the tank 1611 to the tank 1612. Each of the plurality of ventilation paths 1614 is a space between two refrigerant flow paths 1613 adjacent in the second separation direction D5 (see FIG. 4 in particular). In order to improve cooling efficiency, a fin is arranged between the plurality of refrigerant flow paths 1613, that is, in each of the ventilation paths 1614. Since the fin is not a main part of the present example embodiment, illustration of each fin is omitted.

The second radiator 162 has two tanks 1621 and 1622, a plurality of refrigerant flow paths 1623, and a plurality of ventilation paths 1624, and cools the refrigerant circulating in the plurality of refrigerant flow paths 1623 with air flowing through the plurality of ventilation paths 1624. The second radiator 162 may be the same as the first radiator 161. Therefore, a detailed description of the second radiator 162 will be omitted.

The first radiator 161 and the second radiator 162 overlap each other in the orthogonal direction D6. The orthogonal direction D6 is orthogonal to each of the first separation direction D4 and the second separation direction D5. Specifically, the first radiator 161 overlaps the second radiator 162 on the first direction other side Z2 relative to the second radiator 162.

The first radiator 161 and the second radiator 162 are arranged to be inclined with respect to the first surface 111 of the casing 11. Therefore, the refrigerant flow paths 1613 and 1623 become longer than those when the refrigerant flow path is not inclined with respect to the first surface 111. Similarly, the ventilation paths 1614 and 1624 also become long. Therefore, the total opening area (total cross-sectional area) of the ventilation paths 1614 and 1624 becomes larger than that when the refrigerant flow path is not inclined with respect to the first surface 111 (see FIG. 4 in particular). As a result, it is possible to provide the cooling assembly 1 having high cooling performance.

Specifically, as shown in FIGS. 2 and 3, the tanks 1611 and 1622 are positioned near a first corner 117 in the internal space 11C. The first corner 117 is defined by an end on the third direction one side Y1 of the first surface 111 and an end on the first direction one side Z1 of the fifth surface 115. The tanks 1612 and 1621 are arranged near a second corner 118 in the internal space 11C. The second corner 118 is defined by an end on the third direction other side Y2 of the second surface 112 and an end on the first direction other side Z2 of the sixth surface 116. Each of the refrigerant flow paths 1613 and 1623 extends along the first separation direction D4 while being inclined with respect to the first surface 111 between the first corner 117 and the second corner 118. Therefore, the length of each of the refrigerant flow paths 1623 and 1613 along the first separation direction D4 can be made relatively long. Similarly, the distance between both ends of each of the ventilation paths 1624 and 1614 in the first separation direction D4 can be made relatively long. That is, the total opening area (total cross-sectional area) of each of the ventilation paths 1624 and 1614 can be made relatively large.

A first installation space 119 is defined in the internal space 11C. That is, the first installation space 119 is a space between the surface of the second radiator 162 on the first direction one side Z1 and the first surface 111.

The pumps 131 and 132 of the pump unit 13 are arranged in the third direction Y in the first installation space 119. The pump 131 is positioned on the third direction other side Y2 relative to the pump 132. Specifically, the entire pump 132 and a part of the pump 131 are positioned between the second radiator 162 and the first surface 111. Therefore, the second radiator 162 and the pump 131 are densely arranged in the casing 11. As a result, the cooling assembly 1 that is small in size can be provided. At least a part of the pump 132 is only required to be positioned between the second radiator 162 and the first surface 111.

When the cooling assembly 1 includes the plurality of pumps 131 and 132 as in the example embodiment, at least the entire pump 132 of the pumps 131 and 132 is positioned between the second radiator 162 and the first surface 111. Therefore, the second radiator 162 and the plurality of pumps 131 and 132 can be densely arranged in the casing 11.

More specifically, the entire pump 132 and a part of the pump 131 overlap the second radiator 162 in the first direction Z. The pumps 131 and 132 overlaps the second radiator 162 in the third direction Y. Therefore, the second radiator 162 and the pump unit 13 are arranged more densely in the casing 11.

A second installation space 1110 is further defined in the internal space 11C. The second installation space 1110 is a space between the surface of the first radiator 161 on the first direction other side Z2 and the second surface 112.

The power source assembly 19 is positioned in the second installation space 1110. Therefore, the power source assembly 19 is positioned above the first radiator 161. As a result, even when the refrigerant leaks from the first radiator 161 and/or the second radiator 162, the refrigerant does not drop onto the power source assembly 19. Even when water droplets are generated in the casing 11 due to dew condensation, the water droplets are less likely to adhere to the power source assembly 19.

At least a part of the tank 12 is positioned in the first installation space 119, that is, between the second radiator 162 and the first surface 111. Therefore, the second radiator 162, the pump 131, and the tank 12 are densely arranged in the casing 11.

The tank 12 is arranged side by side with the pump unit 13 on the second direction other side X2 in the first installation space 119. As a result, the second radiator 162, the pump 131, and the tank 12 are arranged more densely.

As shown in FIGS. 2 and 3, the two radiators, that is, the first radiator 161 and the second radiator 162 are arranged side by side in the first direction Z. A gap G1 in the first direction Z may be generated between end surfaces on the second direction one side X1 in the first radiator 161 and the second radiator 162 (see FIG. 2 in particular). A gap G2 in the first direction Z may be generated between end surfaces on the second direction other side X2 in the first radiator 161 and the second radiator 162 (see FIG. 3 in particular).

In the example embodiment, the cooling assembly 1 further includes a first occlusion part 21 and a second occlusion part 22. Each of the first occlusion part 21 and the second occlusion part 22 is made of metal or resin, and is a plate-like member expanding in the first direction Z and the third direction Y. Each of the first occlusion part 21 and the second occlusion part 22 occludes the gaps G1 and G2. Therefore, when the air blowing assembly 17 generates an airflow in the ventilation paths 1614 and 1624, the air does not leak from the gaps G1 and G2. As a result, there is no difference in the flow rate of the air in the ventilation paths 1614 and 1624. Therefore, degradation of the cooling performance of the cooling assembly 1 is suppressed.

The airflow by the air blowing assembly 17 flows from the second radiator 162 toward the first radiator 161. That is, in the casing 11, the high-temperature air flows obliquely upward. Therefore, heat is hardly confined in the casing 11. Since the airflow of the air blowing assembly 17 first cools a relatively low-temperature refrigerant by the second radiator 162, a relatively high-temperature refrigerant can also be cooled by the first radiator 161.

The power source assembly 19 is positioned on the downstream side of the airflow relative to the first radiator 161. Therefore, the airflow causes the high-temperature air around the power source assembly 19 to move away from the power source assembly 19 and the heat exchange unit 16, and to be discharged from the exhaust port 115A. As a result, the inside of the casing 11 is suppressed from being excessively heated.

As shown in FIGS. 2 and 3, the first radiator 161 is connected to the tank 12 by the pipe 188. The tank 12 is connected to the pump unit 13 by the pipes 181 and 182. The pump unit 13 is connected to the second radiator 162 by the pipes 183 to 185. At the time of operation of the pumps 131 and 132, the pipes 181 to 185 and 188 allow the refrigerant to circulate the first radiator 161, the tank 12, the pump unit 13, and the second radiator 162 in this order. Therefore, the lengths of the pipes 181 to 185 and 188 are suppressed.

In the casing 201, the size (i.e., width) in the first direction Z is smaller than the size of the pumps 131 and 132 or the tank 12 in the same direction. The casing 201 is positioned in the first installation space 119. Specifically, the casing 201 is positioned between the second radiator 162 and the first surface 111 in the first direction Z. The casing 201 is positioned between the pump 131 or the tank 12 and the second radiator 162 in the third direction Y. Therefore, the second radiator 162, the pumps 131 and 132 or the tank 12, and the casing 201 of the controller 20 are densely arranged in the casing 11.

As shown in FIG. 4, in the first radiator 161, each of the ventilation paths 1614 has an opening 1615 opened to one side (i.e., obliquely upward) in the orthogonal direction D6. Each of the fans 171 has a suction port 1711 of air, a discharge port 1712 of air, and an impeller that is not shown. In FIG. 4, for convenience, reference numerals "1711" and "1712" are given only to a single fan 171. Each suction port 1711 opposes the opening 1615 in the ventilation path 1614 in the orthogonal direction D6. Therefore, when each of the fans 171 rotates its own impeller, a large flow rate of airflow can be generated from the suction port 1711 to the discharge port 1712.

The plurality of fans 171 are arrayed in both directions of the first separation direction D4 and the second separation direction D5 of the first radiator 161, and cover the opening 1615 in the entire ventilation path 1614. Therefore, the plurality of fans 171 can generate a larger flow rate of airflow from the suction port 1711 to the discharge port 1712.

An example embodiment of the present disclosure has been described with reference to the drawings. However, the present disclosure is not limited to the above example embodiment, and can be implemented in various modes without departing from the gist of the present disclosure. The plurality of constituent elements disclosed in the above example embodiment can be appropriately modified. For example, a certain constituent element of all constituent elements shown in a certain example embodiment may be added to a constituent element of another example embodiment, or some constituent elements of all constituent elements shown in a certain example embodiment may be removed from the example embodiment.

The drawings schematically show each constituent element mainly in order to facilitate understanding of the present disclosure, and the thickness, length, number, interval, and the like of each constituent element that is shown may be different from the actual ones for convenience of the drawings. The configuration of each constituent element shown in the above example embodiment is an example and is not particularly limited, and it goes without saying that various modifications can be made without substantially departing from the effects of the present disclosure.

The air blowing assembly 17 may be away from the first radiator 161. Specifically, the air blowing assembly 17 is provided in the exhaust port 115A.

The pump unit 13 may have at least one pump.

The air blowing assembly 17 may have a blower in place of the fan 171.

The present technology can also adopt the following configurations.

(1) A cooling assembly including:

a radiator that has a plurality of refrigerant flow paths and a plurality of ventilation paths, and cools a refrigerant circulating in the plurality of refrigerant flow paths with air flowing through the plurality of ventilation paths;

a pump that is connected to the radiator and pressurizes the refrigerant; and a casing that accommodates the radiator and the pump, in which the radiator is arranged to be inclined with respect to a first surface of the casing, and at least a part of the pump is positioned between the radiator and the first surface.

(2) The cooling assembly according to (1) in which a plurality of the pumps are provided, and an entirety of at least one of the plurality of pumps is positioned between the radiator and the first surface.

(3) The cooling assembly according to (1) or (2), further including a power source assembly that generates a drive voltage of the pump, in which the power source assembly is positioned above the radiator.

(4) The cooling assembly according to any of (1) to (3), further including:

a tank that stores the refrigerant, in which the casing further accommodates the tank, and at least a part of the tank is positioned between the radiator and the first surface.

(5) The cooling assembly according to any of (1) to (4), further including:

an air blowing assembly having a suction port of air opposing an opening of the ventilation path and a discharge port of air, in which the air blowing assembly generates an airflow from the suction port toward the discharge port.

(6) The cooling assembly according to any of (1) to (5) in which two of the radiators are provided and arranged side by side in a first direction orthogonal to the first surface, the cooling assembly further including:

a first occlusion part that occludes a gap in the first direction of an end surface on one side in a second direction orthogonal to the first direction in the two radiators; and a second occlusion part that occludes a gap in the first direction of an end surface on the other side in the second direction in the two radiators.

(7) The cooling assembly according to any of (1) to (6) in which a first radiator and a second radiator positioned between the first radiator and the first surface are provided as the radiator, the cooling assembly further including:

a tank at least a part of which is positioned between the second radiator and the first surface, the tank storing the refrigerant; and a pipe that allows the refrigerant to circulate in order of the first radiator, the tank, the pump, and the second radiator.

(8) The cooling assembly according to (7), further including an air blowing assembly that generates an airflow from the second radiator toward the first radiator.

(9) The cooling assembly according to any of (1) to (8), further including:

an air blowing assembly that generates an airflow in the plurality of ventilation paths; and a power source assembly that generates a drive voltage of the pump, in which the power source assembly is positioned on a downstream side of the airflow relative to the radiator.

(10) The cooling assembly according to any of (1) to (9), further including:

a controller that controls the pump, in which at least a part of the controller has a width in a first direction orthogonal to the first surface that is smaller than a width of the pump, is positioned between the radiator and the first surface in the first direction, and is positioned between the pump or the tank and the radiator in a third direction along the first surface.

The cooling assembly according to the present disclosure is suitable for cooling an electronic device, for example.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooling assembly comprising:

a first radiator that includes a plurality of refrigerant flow paths and a plurality of ventilation paths to cool a refrigerant circulating in the plurality of refrigerant flow paths with air flowing through the plurality of ventilation paths;

a second radiator;

a pump that is connected to the first radiator to pressurize the refrigerant;

a power source to generate a drive voltage of the pump;

an air blower including a suction port to suction air opposing an opening of the plurality of ventilation paths and a discharge port;

a casing that accommodates the first radiator and the pump; and a tank to store refrigerant to replenish portions of the refrigerant circulating in the plurality of refrigerant flow paths; wherein the first radiator is inclined with respect to a first surface of the casing;

at least a portion of the pump is positioned between the first radiator and the first surface;

a portion of the power source is located between the first radiator and a second surface of the casing which is opposed to the first surface;

the refrigerant circulates in the following order: from the first radiator to the tank, from the tank to the pump, and from the pump to the second radiator:

the first radiator and the second radiator are arranged side by side in a first direction orthogonal to the first surface; and the air blower is operable to generate an airflow from the suction port toward the discharge port, the airflow from the blower flows from the second radiator to the first radiator.

2. The cooling assembly according to claim 1, wherein a plurality of the pumps are provided; and an entirety of at least one of the plurality of pumps is positioned between the first radiator and the first surface.

3. The cooling assembly according to claim 1, wherein the power source is above the first radiator.

4. The cooling assembly according to claim 1, wherein the casing further accommodates the tank; and at least a portion of the tank is positioned between the first radiator and the first surface.

5. The cooling assembly according to claim 1, wherein the cooling assembly further comprises:

a first occlusion portion that occludes a gap in the first direction of an end surface on one side in a second direction orthogonal to the first direction in the first and second radiators; and a second occlusion portion that occludes a gap in the first direction of an end surface on an other side in the second direction in the first and second radiators.

6. The cooling assembly according to claim 1, wherein the cooling assembly further includes a pipe to allow the refrigerant to circulate in order of the first radiator, the tank, the pump, and the second radiator; and at least a portion of the tank is between the second radiator and the first surface.

7. The cooling assembly according to claim 6, further comprising an air blower to generate an airflow from the second radiator toward the first radiator.

8. The cooling assembly according to claim 1, further comprising:

an air blower to generate an airflow in the plurality of ventilation paths; wherein the power source is positioned on a downstream side of the airflow relative to the radiator.

9. The cooling assembly according to claim 1, further comprising:

a controller to control the pump; wherein at least a portion of the controller has a width in a first direction orthogonal to the first surface that is smaller than a width of the pump, is positioned between the first radiator and the first surface in the first direction, and is positioned between the pump or the tank and the first radiator in a third direction along the first surface.

10. The cooling assembly according to claim 1, wherein the first surface and the second surface are parallel to one another.

* * * * *